US011345989B2

(12) United States Patent
Sublemontier et al.

(10) Patent No.: US 11,345,989 B2
(45) Date of Patent: May 31, 2022

(54) DEVICE FOR DEPOSITING NANOMETRIC SIZED PARTICLES ONTO A SUBSTRATE

(71) Applicant: COMMISSARIAT A L'ENERGIE ATOMIQUE ET AUX ENERGIES ALTERNATIVES, Paris (FR)

(72) Inventors: Olivier Sublemontier, Gif (FR); Youri Rousseau, Maisons Laffitte (FR); Christian Petit, Valdahon (FR); Christophe Muller, Valdahon (FR); Alain Billard, Exincourt (FR); Pascal Briois, Bethoncourt (FR); Frédéric Perry, Etupes (FR); Jean-Paul Gaston, Vert le Grand (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 41 days.

(21) Appl. No.: 16/966,417

(22) PCT Filed: Jan. 30, 2019

(86) PCT No.: PCT/EP2019/052272
§ 371 (c)(1),
(2) Date: Dec. 17, 2020

(87) PCT Pub. No.: WO2019/149763
PCT Pub. Date: Aug. 8, 2019

(65) Prior Publication Data
US 2021/0108305 A1    Apr. 15, 2021

(30) Foreign Application Priority Data

Jan. 30, 2018   (FR) ...................... 1850744

(51) Int. Cl.
C23C 14/04    (2006.01)
C23C 14/22    (2006.01)
(Continued)

(52) U.S. Cl.
CPC .......... *C23C 14/044* (2013.01); *C23C 14/228* (2013.01); *C23C 14/35* (2013.01);
(Continued)

(58) Field of Classification Search
CPC ..... C23C 14/044; C23C 14/228; C23C 14/35; C23C 14/14; C23C 14/22; C23C 14/04;
(Continued)

(56) References Cited

U.S. PATENT DOCUMENTS

2013/0017367 A1* 1/2013 Ravagnan ............... C23C 14/22
                                                    428/144
2014/0044886 A1* 2/2014 Sublemontier ......... C23C 14/22
                                                    427/535
2015/0361546 A1* 12/2015 Ochi ....................... C23C 14/04
                                                    427/255.28

FOREIGN PATENT DOCUMENTS

EP    2 553 135          2/2013
EP    2 695 967 A1       2/2014
(Continued)

OTHER PUBLICATIONS

WO-2012049428-A2 Translation (Year: 2012).*
(Continued)

*Primary Examiner* — Jennifer Wecker
*Assistant Examiner* — Patrick S Ott
(74) *Attorney, Agent, or Firm* — Christensen O'Connor Johnson Kindness PLLC

(57) ABSTRACT

A device (1) for coating a substrate (4) with nanometric sized particles, wherein the device comprises: a plurality of aerodynamic lenses able to product a jet (3) of nanometric
(Continued)

sized particles, each of the aerodynamic lenses having a longitudinal axis, the aerodynamic lenses being arranged so that the various longitudinal axes are parallel and oriented in a first direction (X) defining the direction of propagation of the jet and in the form of at least two columns (9, 10) offset from each other in a second direction (Y) orthogonal to the first direction, where the first and the second column each comprise at least one of the aerodynamic lenses, the at least one of the aerodynamic lenses of the first column also being offset relative to the at least one of the aerodynamic lenses of the second column in a third direction (Z) that is both orthogonal to the first direction and to the second direction.

11 Claims, 5 Drawing Sheets

(51) Int. Cl.
*C23C 14/35* (2006.01)
*H01J 37/32* (2006.01)
*H01J 37/34* (2006.01)

(52) U.S. Cl.
CPC ...... *H01J 37/32715* (2013.01); *H01J 37/347* (2013.01); *H01J 2237/20228* (2013.01)

(58) Field of Classification Search
CPC ................. C23C 14/042; C23C 14/048; H01J 37/32715; H01J 37/347; H01J 2237/20228; H01J 2237/0451; H01J 2237/083; H01J 37/3178; H01J 37/301; H01J 37/32642; H01J 2237/3171; H01J 2237/31711; B82Y 40/00; H01L 21/0268; H01L 21/266
USPC ................. 204/298.11, 298.07; 427/468, 526
See application file for complete search history.

(56) References Cited

FOREIGN PATENT DOCUMENTS

| GB | 2530562 A | * | 3/2016 | ........... C23C 14/228 |
|----|-----------|---|--------|------------------------|
| GB | 2530562 A |   | 3/2016 |                        |
| WO | 2006/037153 A1 |   | 4/2006 |                 |
| WO | WO-2006037153 A1 | * | 4/2006 | ........... C23C 16/042 |
| WO | 2011/121017 A1 |   | 10/2011 |                |
| WO | WO-2012049428 A2 | * | 4/2012 | ............... B05D 1/12 |

OTHER PUBLICATIONS

International Search Report and Written Opinion dated Feb. 28, 2019, issued in corresponding International Application No. PCT/EP2019/052272, filed Jan. 30, 2019, 32 pages.

* cited by examiner

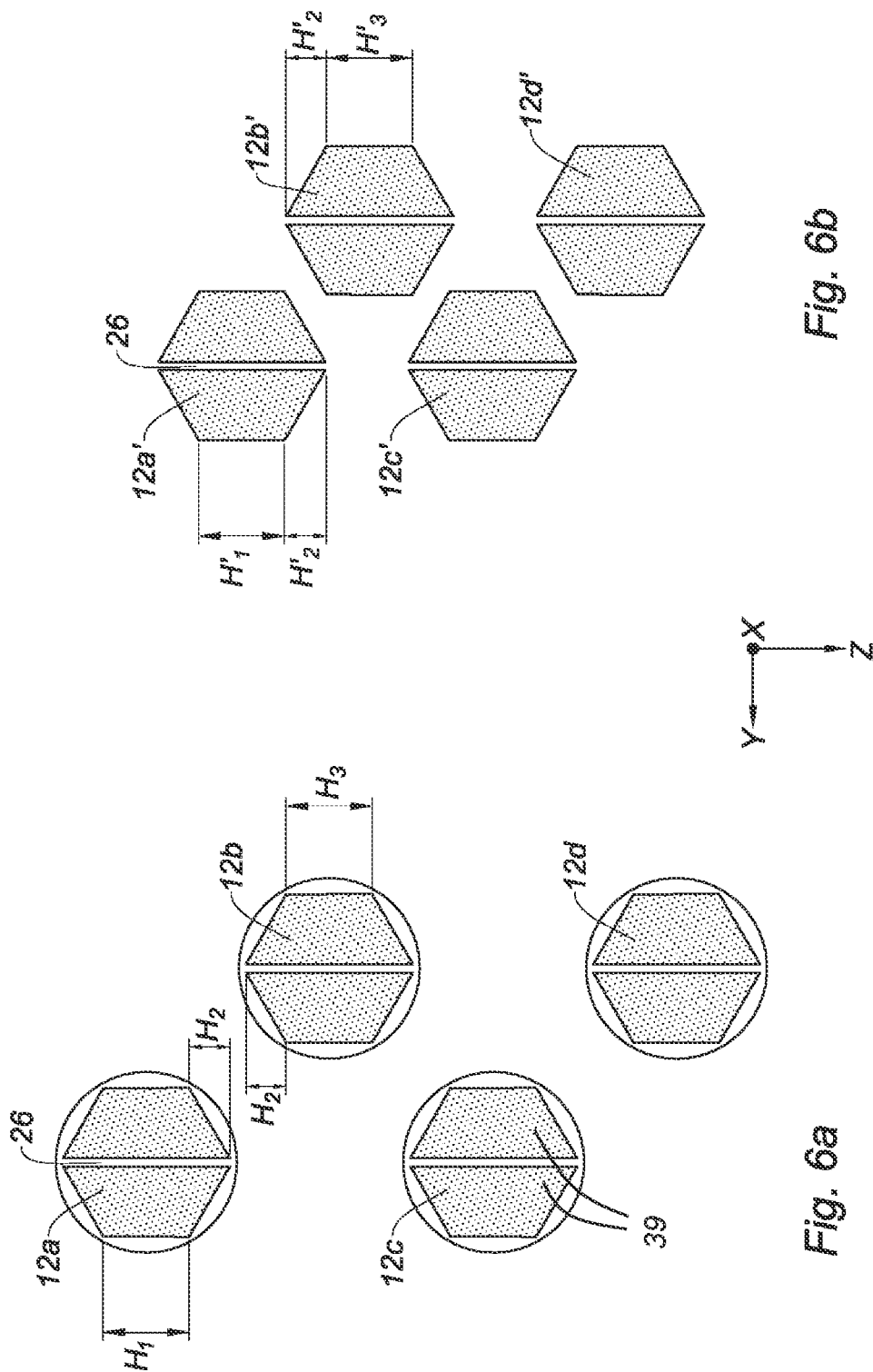

DEVICE FOR DEPOSITING NANOMETRIC SIZED PARTICLES ONTO A SUBSTRATE

The invention relates to the field of synthesising nanostructured composite materials.

These materials are formed by nanoparticles coated or not in a matrix of a different material.

By nanoparticles, this means particles, generally solid, of which the size is comprised between 1 nm (nanometre) and a few hundred nanometres.

Nanostructured composite materials have properties which are singularly different from those of the same material in the solid state, in particular according to the size of the nanoparticles coated in the matrix.

There are various techniques for forming such materials on a target surface, hereinafter the substrate.

One of them consists of coupling two separate systems, one for depositing the nanoparticles on a substrate, the other for depositing the matrix on said substrate, matrix wherein the nanoparticles are intended to be coated, if necessary.

A device comprising a deposition chamber and a system for generating a jet of nanoparticles in a carrier gas is known. The deposition chamber comprises a deposition system, which can be formed by one or more cathodes for magnetron sputtering, a matrix on a substrate.

The system for generating a jet of nanoparticles comprises an expansion chamber provided with an outlet orifice for the nanoparticles to the synthesis chamber. In this device, the distance between the outlet orifice of the expansion chamber and the substrate is adjustable.

This device has the advantage of producing homogenous coatings and of allowing the synthesis of a nanostructured composite material with a potentially limitless choice in respective chemical natures of the core of the nanoparticles and of the matrix which coats them. By "homogenous coating", this means a coating of which the thickness on the one hand, and the local three-dimensional concentration of nanoparticles, on the other hand, are substantially constant.

However, a disadvantage of the device mentioned is that it allows a homogeneity on surfaces of a limited scope, typically of the order of ten square centimetres.

Industrial applications require being able to produce substrates of which the coating is homogenous on larger surfaces, and for example, at least one hundred square centimetres.

Starting with the device of the prior art mentioned, a possibility consists of extending the substrate of the system to generate a jet of nanoparticles so as to allow the coating of a larger surface by utilising the divergence of the jet of nanoparticles. However, the working pressure in the expansion chamber is of the order of $5 \times 10^{-3}$ mbar to make the magnetron sputtering work under standard conditions. In this case, the extension of the distance between the source of the jet of nanoparticles and the substrate becomes too big to guarantee the integrity of the jet. Another possibility consists of using a system to generate jets of nanoparticles, which are more voluminous. But, a homothety of ratio $\alpha$ of the substrate also requires pumping means multiplied by $\alpha$. Such a pumping system induces additional costs which are incompatible with industrial applications. Another reason resides in the intrinsic properties of the carrier gas and in particular, its dynamic viscosity, which implies that its flow properties are not transposable by a simple homothety. Due to this, the paths of nanoparticles are difficult to predict and the homogeneity of the depositions is thus not guaranteed.

The invention aims to overcome at least one of the abovementioned disadvantages.

In particular, an aim is to allow the homogenous coating of substrates on surfaces which are larger than in the state of the art, and for example, at least equal to 100 cm$^2$.

To this end, the invention proposes a device for depositing nanometric sized particles on a substrate characterised in that the device comprises:

means called production means, each able to produce, from an end of the production means, a jet of nanometric sized particles, each of said production means being configured to have a longitudinal axis oriented in a first direction X defining an axis of propagation of the jet, and configured so that the jet is divergent from a point P of divergence with a half-angle of divergence $\alpha$ with respect to its axis of propagation, the production means being arranged so that the various longitudinal axes are parallel to each other and in the form of at least one first column and a second column offset with respect to each other in a second direction Y orthogonal to the first direction X, where the first column 9 and the second column each comprise at least one production means, said at least one production means of the first column being moreover offset with respect to said at least one production means of the second column in the third direction Z, both orthogonal to the first direction X and to the second direction Y, an expansion chamber, wherein at least each end of the production means are housed;

a deposition chamber comprising:
said substrate
a means for gripping the substrate, able to move said substrate in the second direction Y
a plurality of masks each comprising an opening, each mask being situated, in the first direction X defining the direction of propagation of the jet, between a production means and the substrate and therefore said masks are also presented in the form of at least one first column and a second column offset with respect to each other in the second direction Y, where the first column and the second column each comprise at least one mask, said at least one mask of the first column being moreover offset with respect to said at least one mask of the second column in the third direction Z, and therefore, always in the first direction X defining the propagation of the jet, the masks are separated by a first distance $d_1$ from the point P of divergence of the jet and by a second distance $d_2$ from the substrate and each opening being provided with a centre through which the longitudinal axis of the associated production means passes, the centres of two openings, closest to and belonging to different columns being separated by a distance a in the third direction Z and by a distance b in the second direction Y, each opening of a mask being inscribable in a circle of diameter $2d_1 \sin \alpha$, the opening of said at least one mask of the first column defining:

a first central portion, of which the width $L_1$, defined in the second direction Y, is constant, and of which the height $H_1$, defined in the third direction Z, is also constant, a second portion 21, of which the width $L_3$, defined in the second direction Y, is variable in the third direction Z, the opening of said at least one mask of the second column defining:

a third central portion, of which the width $L_2$, defined in the second direction Y, is constant and equal to the width $L_1$, and of which the height $H_3$, defined in the third direction Z, is also constant, and a fourth portion 22, of which the width $L_4$, defined in the second direction Y, is variable in the third direction Z, said second portion and fourth portion being, on the one hand, situated between said first portion and third portion and having, on the other hand, a maximum height $H_2$, defined in the third identical direction Z, the sum $S=L_3+L_4$ of the variable widths in the third direction of the second portion and the fourth portion of said masks, when the latter are put opposite each other in the third direction Z, being constant and equal to $L_1$, the following relationships being furthermore respected:

$$a = \frac{1}{f}\left(\frac{H_1}{2} + H_2 + \frac{H_3}{2}\right) \text{ and } b \geq \frac{1}{f}\frac{L_1}{2}$$

where:

$$f = \frac{d_1}{d_1 + d_2}$$

Such a device advantageously makes it possible to obtain a homogenous coating of substrates on large surfaces. In particular, this device thus makes it possible to produce homogenous coatings of the order of one hundred square centimetres raising the technical lock which previously prevented industries from using this type of coating.

Various additional features can be provided individually or in combination:

the opening of said at least one mask of the first column and the opening of said at least one mask of the second column have different shapes.

the opening of said at least one mask of the first column and the opening of said at least one mask of the second column have identical shapes.

the opening of said at least one mask of the first column and the opening of said at least one mask of the second column have a hexagonal shape.

the mask comprises a strip which extends in the third direction Z and separates each opening into two.

at least one deposition system of a matrix is provided on the substrate.

a plurality of deposition systems of a matrix is provided on the substrate, said deposition systems being arranged symmetrically with respect to the first direction X.

the position of the or of each deposition system of the matrix on the substrate is adjustable, for example to make the distance between said system and/or the deposition angle of the matrix vary with respect to the substrate.

The invention also proposes an assembly comprising a device according to the invention and a system for transporting particles intended to supply the production means of said device, the system comprising means able to generate an aerosol, a critical orifice, a flow separator, a flange for distributing the production means and a buffer volume situated between the critical orifice and the flow separator, system wherein, the critical orifice is placed before the flow separator.

This assembly can comprise at least one of the following additional features, taken individually or in combination:

the volume of the pipe(s) between the critical orifice and the flow separator is less than or equal to 10 $cm^3$.

pipes between the flow separator and the distribution flange are straight or slightly curved.

Other particularities and advantages of the invention will also appear in the description below in relation to the appended drawings, given as non-limiting examples, wherein:

FIG. 3a is a front view of several masks used in the device of FIGS. 1 and 2 and arranged according to the invention;

FIG. 3b is a front view of a deposition obtained on a substrate with masks arranged according to FIG. 3a;

FIG. 4a is a front view of several masks according to an embodiment variant of the invention;

FIG. 4b is a front view of a deposition obtained on a substrate with masks arranged according to FIG. 4a;

FIG. 5 is a front view of a deposition on the substrate from the mask of FIG. 4a;

FIG. 6a is a front view of several masks according to an embodiment variant of the invention;

FIG. 6b is a front view of a deposition obtained on a substrate with masks arranged according to FIG. 6a;

Below in the description, by convention, the direct orthogonal marker defined as follows will be adopted:

an axis X defining a first direction, which corresponds to the direction of propagation of the jets 3 of particles, an axis Y orthogonal to the axis X and defining a second direction, as well as a plane XY, an axis Z both orthogonal to the axis Y and to the axis X and defining a third direction, as well as planes ZY and ZX.

In the embodiments represented in the appended figures, the axis Z is combined with a vertical axis in reference to the Earth's gravity. However, according to the orientation of the device 1, the axis Z can be separate from this vertical axis.

Figure 1:
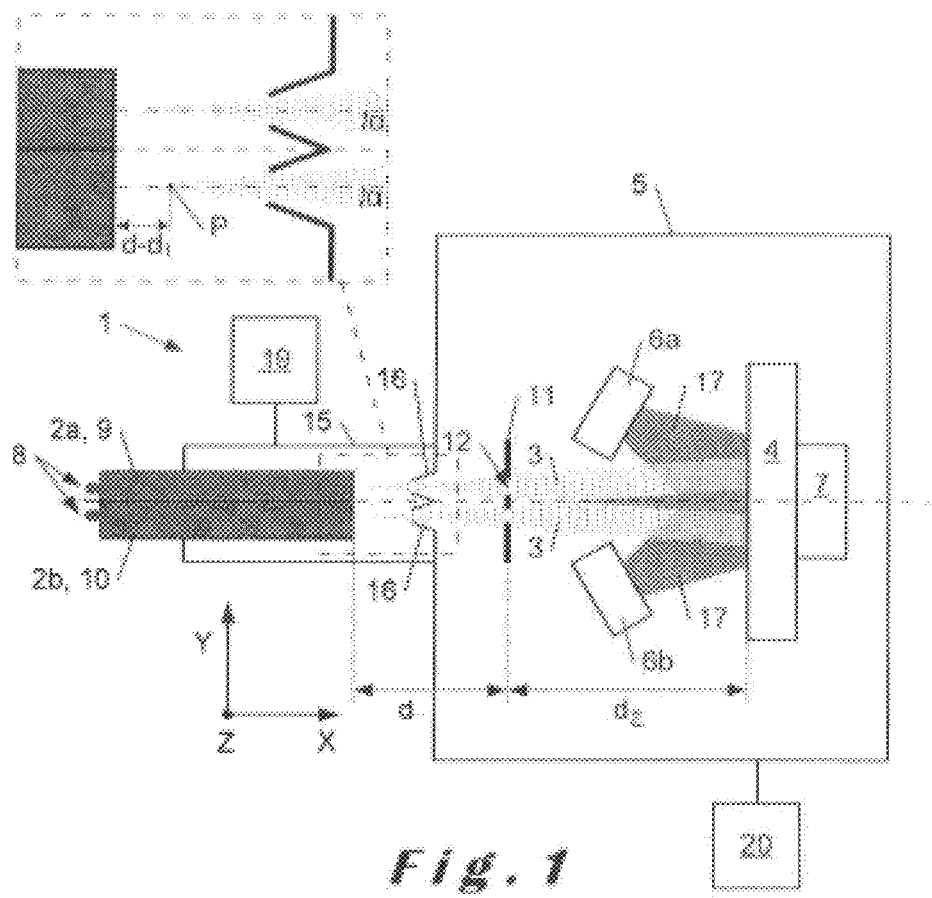
FIG. 1 is a schematic representation of the top of the device according to the invention.
Figure 2:
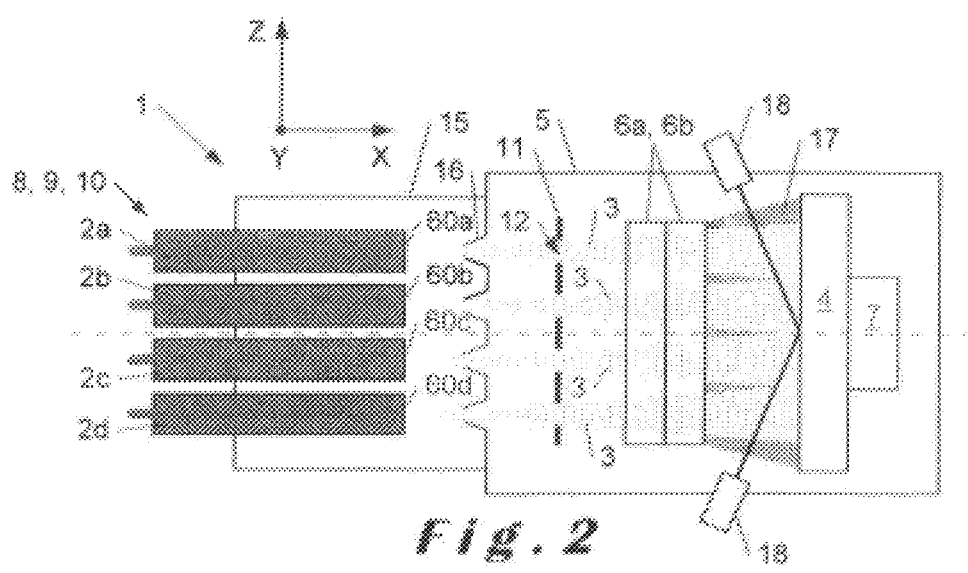
FIG. 2 is a schematic representation of the side of the device represented in FIG. 1.

In FIGS. 1 and 2, a device 1 for depositing nanometric sized particles on a substrate 4 is represented.

The device 1 comprises a plurality of means 2a, 2b, 2c, 2d able to each produce a jet 3 of nanometric sized particles. Below, these means 2a, 2b, 2c, 2d are called production means 2a, 2b, 2c, 2d. More specifically, each of these production means produces a jet 3 of particles in a carrier gas. Each production means is thus able to produce a jet 3 in the first direction (X) in the direction of a substrate 4, this first direction being combined with a longitudinal axis of each production means 2a, 2b, 2c, 2d. This first direction X defines an axis of propagation of the jet 3 of particles. Moreover, each of these production means is configured so that the jet 3 of nanometric sized particles thus produced is divergent from a point P of divergence with a half-angle of divergence a with respect to the axis of propagation of the jet 3.

These production means are associated with an expansion chamber 15, intended to be placed in a high vacuum.

The expansion chamber 15 thus comprises at least one end 60a, 60b, 60c, 60d of the production means 2a, 2b, 2c, 2d. The production means 2a, 2b, 2c, 2d are, for example, aerodynamic lenses 2a, 2b, 2c, 2d. In the embodiment represented in the figures, the expansion chamber 15 comprises four aerodynamic lenses 2a, 2b, 2c, 2d distributed two-by-two between a first column 9 and a second column 10. Thus, the production means 2a, 2b, 2c, 2d are arranged so as to form at least two adjacent columns 9, 10, as illustrated in FIG. 1. The first column 9 comprises at least one production means 2a, 2c and the second column 10 comprises at least one production means 2b, 2d.

Said at least one production means 2a, 2c of the first column 9 is offset with respect to said at least one production means 2b, 2d of the second column 10 about the axis Y. Said at least one production means 2a, 2c of the first column 9 is offset with respect to said at least one production means 2b, 2d of the second column 10 about the axis Z.

The device 1 also comprises a deposition chamber 5 housing the substrate 4 on which the nanometric sized particles are intended to be deposited. The deposition chamber 5 comprises at least one system 6a, 6b for depositing a matrix able to coat the nanometric particles on the substrate 4.

In an embodiment variant not represented in the figures, the deposition chamber 5 does not comprise any system for depositing a matrix. In this case, no matrix deposition is carried out on the substrate and only the nanometric particles are deposited on the substrate. The matrix makes it possible to modify the properties of the deposition.

The device 1 also comprises a means 7 for gripping the substrate 4, able to move the substrate 4 in the second direction (Y). The interest of this gripping means will be explained below.

Figure 3:
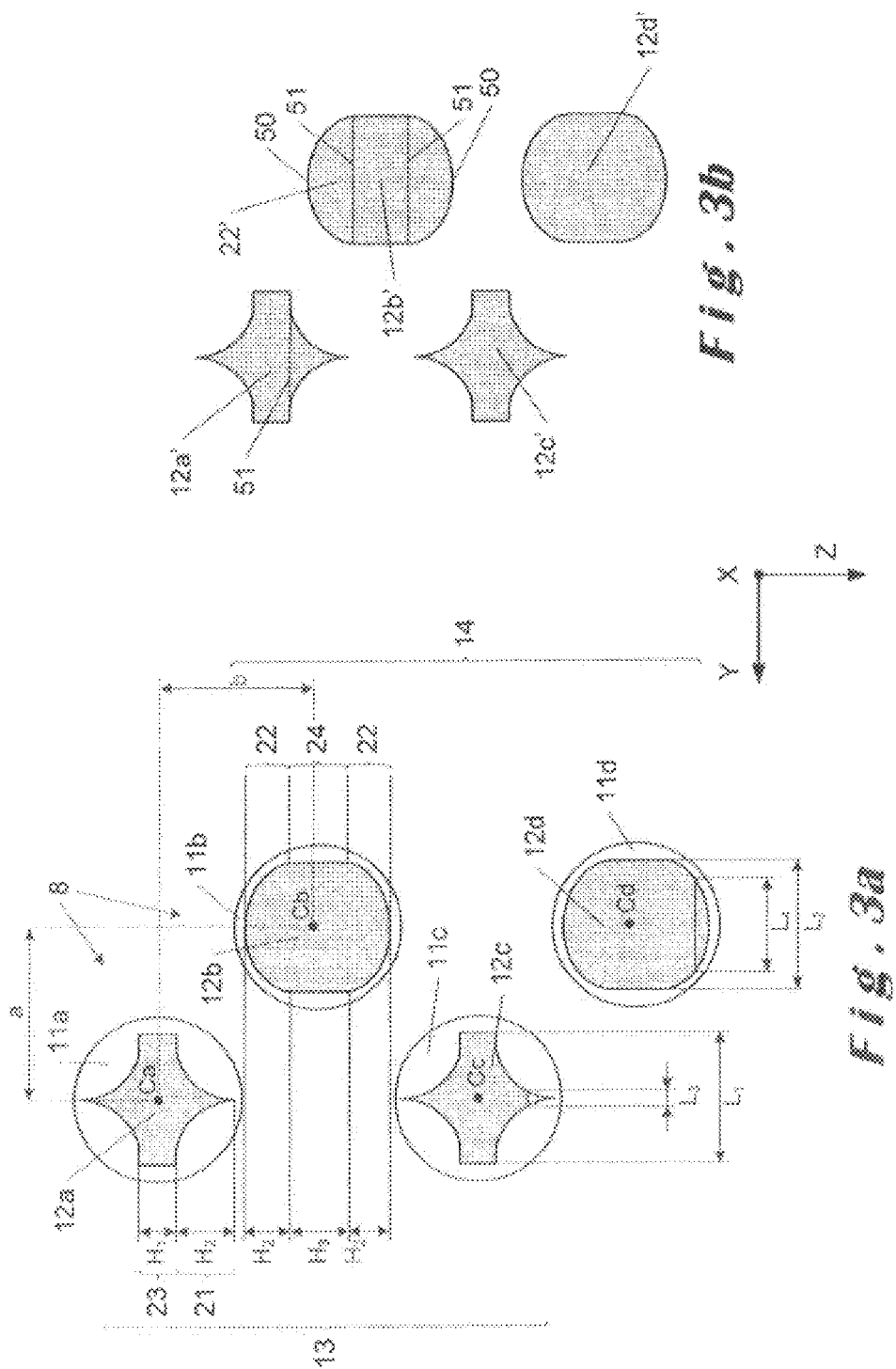
Figure 4:
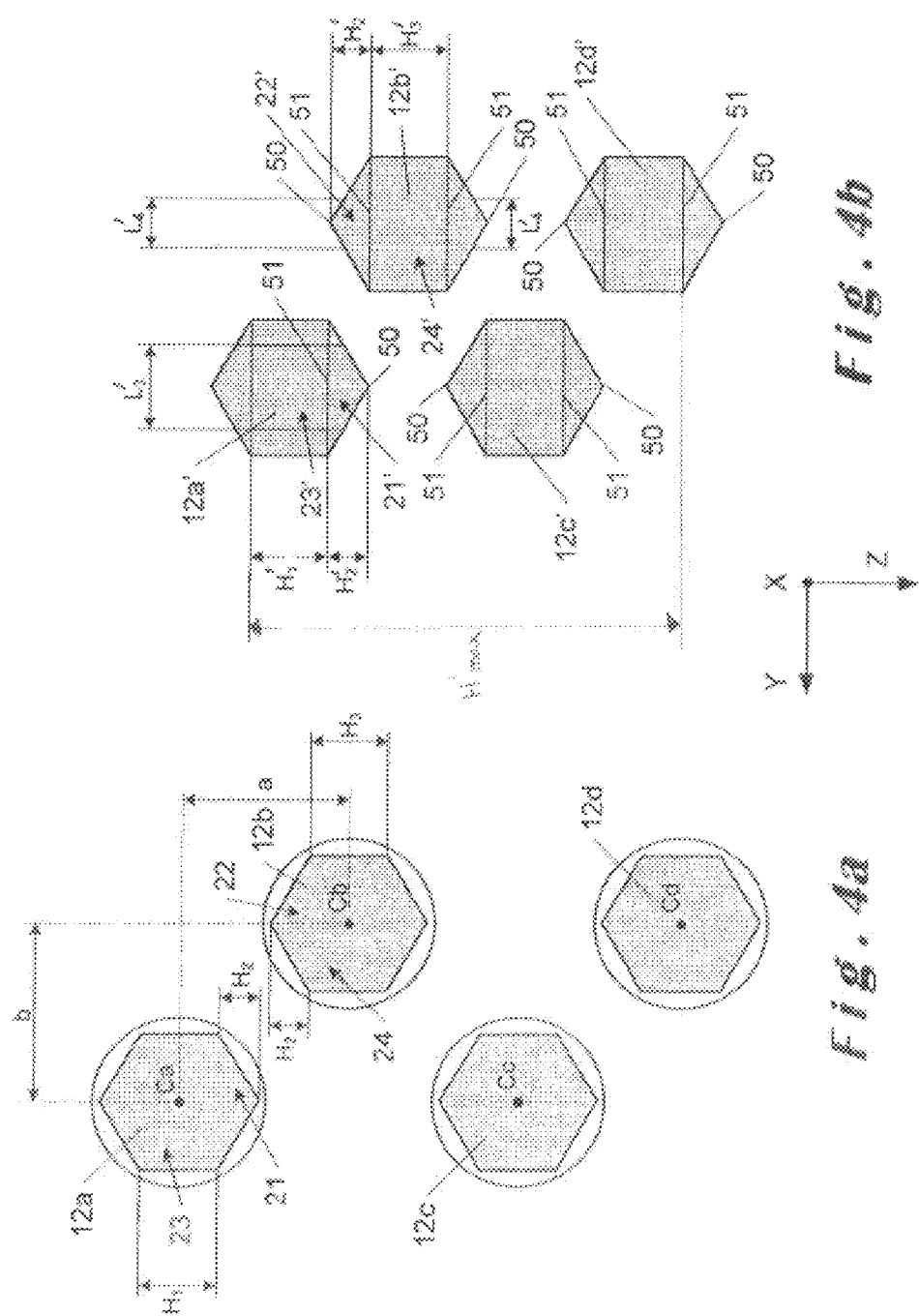

The device 1 further comprises a plurality of masks 11, 11a, 11b, 11c, 11d, advantageously situated in the deposition chamber 5. Each mask 11, 11a, 11b, 11c, 11d defines an opening 12, 12a, 12b, 12c, 12d. Each mask 11, 11a, 11b, 11c, 11d is respectively arranged facing each other, in the first direction (X) corresponding to the direction of propagation of each jet 3, of a production means 2a, 2b, 2c, 2d on the path of the jet 3 of particles. Thus, the masks are also arranged along a first column 13 and a second column 14, according to an offsetting similar to that of the production means 2a, 2b, 2c, 2d. The offsetting of the masks is particularly visible in FIGS. 3a, 4a and 6a.

The opening 12a, 12c of a mask 11a, 11c of the first column 13 defines a first footprint. The opening 12b, 12d of a mask 11b, 11d of the second column 14 defines a second footprint, identical or different, from the first footprint. The footprints of the first column 13 are all identical. The footprints of the second column 14 are all identical.

It is understood that the masks 11, 11a, 11b, 11c, 11d are situated between the corresponding production means 2a, 2b, 2c, 2d and the substrate 4.

The masks make it possible to modify the spatial profile of the jet 3 of particles and contribute to obtaining a homogenous coating over large surfaces. The masks 11, 11a, 11b, 11c, 11d only let the central portion of the jet 3 of particles pass and filter the edges.

The deposition chamber 5 communicates with the expansion chamber 15 via strippers 16. The device 1 comprises as many strippers 16 as production means 2a, 2b, 2c, 2d. The strippers 16 are situated on the path of the jets 3 of particles. The strippers 16 are presented in the form of openings which make it possible to isolate the expansion chamber 15 from the deposition chamber 5 from a standpoint of pressure which is in these two chambers 5, 15. The diameter of the strippers 16 is variable and can be adjusted according to the half-angle of divergence of the jets 3 of particles. The strippers 16 let all of the nanoparticles pass, while drastically limiting the quantity of gas transmitted from the expansion chamber 15 to the deposition chamber 5. Thus, a sufficiently low pressure can be maintained in the deposition chamber 5 to guarantee the integrity of the jet 3, which in the deposition chamber, mainly comprises particles, up to the substrate 4 at pressures which are compatible with the operation of the deposition system 6a, 6b.

The deposition chamber 5 comprises the gripping or substrate support means 7, able to move the substrate 4. The substrate support 7 can be presented in various forms according to which, it is sought to carry out the deposition on a flexible substrate 4, for example as a coil as used in the industry, or also on a rigid substrate 4.

The substrate 4 can be heated and/or polarised in order to obtain denser coatings having better mechanical properties, such as hardness. To this end, the device 1 can comprise means for heating and/or polarising the substrate (not represented).

Advantageously, the or each deposition system 6a, 6b is a magnetron cathode. When, advantageously, several deposition systems 6a, 6b are provided, they are arrange symmetrically with respect to the axis X to improve the homogeneity of the deposition of the matrix. In the appended figures, the deposition chamber 5 moreover comprises two magnetron cathodes 6a, 6b. However, this figure can be greater according to the extent of the surface to be coated.

The magnetron cathodes 6a, 6b allow the covering of the substrate by a matrix at the same time as the particles, this matrix being intended to coat the particles. As can be seen in FIGS. 1 and 2, a spatial profile 17 for projecting the matrix by the magnetron cathodes 6a, 6b covers the jets 3 of nanoparticles. In order to guarantee a constant thickness of the deposition of the matrix under various deposition conditions (pressure, material deposited, type of supply used and power of the supply used), the position of the magnetron cathodes 6a, 6b is advantageously adjustable. For example, the distance between a deposition system and the substrate can be adjusted. This distance can be typically adjusted between 5 cm and 20 cm. Also, the deposition angle of the material can be adjusted with respect to the substrate (which is flat). Thus, this angle can be adjusted so as to be comprised between 450 and 80°.

The deposition chamber 5 advantageously comprises characterisation devices 18 in situ. These devices 18 are visible in FIG. 2. Advantageously, these devices 18 use spectral ellipsometry. They make it possible to monitor, in real time, and in different places, the optical properties of the deposition carried out.

The device 1 comprises pumping means 19, 20 able to create a vacuum in the expansion chamber 15 and in the deposition chamber 5, respectively. First pumping means 20 are able to create a vacuum of which the pressure is of the order of $5 \times 10^{-3}$ mbar in the deposition chamber 5 when the device 1 operates and of the order of $10^{-5}$ mbar in the absence of any jet, i.e. when the device 1 does not operate. A pressure less than $5 \times 10^{-2}$ when operating is desirable for guaranteeing the integrity of the path of the particles through the deposition chamber 5. Second pumping means 19 are able to create a vacuum of the order of 1 mbar in the expansion chamber 15. The pumping means 19 can be pumps, for example of the multistage roots type. The pumping means 20 can be pumps, for example of the turbomolecular type or of the roots type.

Below, the conditions for obtaining a homogenous coating over a large surface will be specified, in reference to FIGS. 3 to 7.

To this end, the arrangement of the masks is not random.

It has already been noted that each mask 11a, 11b, 11c, 11d was in correspondence, therefore in particular in the form of two columns, each comprising at least one mask with a certain offsetting in the directions Y and Z, of a production means 2a, 2b, 2c, 2d over the path of a jet 3 of particles (axis X). This is a condition for obtaining a homogenous deposition of nanometric sized particles on the substrate.

Other conditions relating to the arrangement of masks, as well as the shape of the openings of these masks, are significant for obtaining a homogenous deposition on the substrate 4.

First, a certain number of geometric parameters will be defined, relating to the arrangement of the masks, as well as to the openings of these masks.

The masks 11, 11a, 11b, 11c, 11d are separated by a distance d of the end 60a, 60b, 60c, 60d of the corresponding production means, taken in the first direction X. The masks 11, 11a, 11b, 11c, 11d are moreover separated by a distance $d_2$ from the substrate 4, taken in the first direction X.

The jet 3 coming from each production means 2a, 2b, 2c, 2d is a divergent jet. This implies that the spatial profile of the jet extends as the end 60a, 60b, 60c, 60d of the corresponding production means is extended. It is therefore understood that the positioning of the masks between the production means and the mask is significant. More specifically, a homothety ratio can be defined, allowing to connect the ratio between the dimensions of the deposition, on the substrate 4, coming from a mask, and the dimensions of the openings 12a, 12b, 12c, 12d of the masks (homothety factor). This homothety factor is expressed as follows:

$$f = \frac{d_1}{d_1 + d_2}$$

This homothety factor f is the same for all of the masks and it is therefore understood that, as is moreover visible in the appended figures that all the masks are situated in one same plane, in this case, the plane XZ (FIG. 2, for example).

The distance $d_1$ introduced above can correspond to the distance d between the end 60a, 60b, 60c, 60d and the plane wherein the masks 11, 11a, 11b, 11c, 11d are situated. However, it must be noted that, in particular in the case of an aerodynamic lens, the jet 3 coming from this aerodynamic lens is generally first convergent then divergent. The distance $d_1$ is therefore the distance between the point P of divergence of the jet 3 (=point P of passage from the convergence to the divergence of the jet 3) and the plane wherein the masks 11, 11a, 11b, 11c, 11d are situated. This aspect will be revisited later.

The half-angle α of divergence of the jet 3 is therefore defined from this point P of divergence.

Moreover, each opening 12a, 12b, 12c, 12d is provided with a centre Ca, Cb, Cc, Cd, the centres Ca, Cb, Cc, Cd of two openings the closest to and belonging to the different columns 13, 14 of masks being separated by a distance a in the third direction Z and by a distance b in the second direction Y (see FIG. 3a or 4a, for example).

As has been indicated above, the axis of propagation of a jet 3 of particles is defined by the first direction X, which is combined with the longitudinal axis of the production means having produced this jet 3. The placement of the masks 11a, 11b, 11c, 11d is carried out so that the axis of propagation of the jet 3, and this for each jet coming from a production means, passes through the centre Ca, Cb, Cc, Cd of the opening of the mask associated with said production means. This comes back to saying that the longitudinal axis of a production means passes through the centre of the opening of the associated mask.

The opening 12a, 12c of said at least one mask of the first column 13 of masks defines:
a first central portion 23, of which the width $L_1$, defined in the second direction Y, is constant, and of which the height $H_1$, defined in the third direction Z, is also constant,
a second portion 21, of which the width $L_3$, defined in the second direction Y, is variable in the third direction Z.

The opening 12b, 12d of said at least one mask of the second column 13 of masks defines:
a third central portion 24, of which the width $L_2$, defined in the second direction Y, is constant and of which the height $H_3$, defined in the third direction Z, is also constant, and
a fourth portion 22, of which the width $L_4$, defined in the second direction (Y), is variable in the third direction (Z).

Given the parameters defined above, the additional conditions for obtaining a homogenous deposition are as follows.

So that the particles pass through all of the opening, it must be that the opening of the mask is inscribable in a circle of diameter $D_j'$:

$$D_j' = 2d_1 \sin \alpha$$

and advantageously that it is inscribable in a circle of diameter that is strictly (slightly) less than $D_j'$, to avoid the edge effects on the opening of the mask.

Other conditions are as follows:
The width $L_1$ is equal to the width $L_2$.
The following relationship is verified:

$$b \geq \frac{1}{f} \frac{L_1}{2}$$

The two conditions mentioned above, relating to the masks and to their openings, make it possible avoid a covering of the depositions between the two masks closest to the two different columns 13, 14 of masks.

Furthermore, always given the parameters defined above, the following additional conditions must also be respected:

The second portion 21 and the fourth portion 22 are situated between said first portion 23 and third portion 24. In addition, the second portion 21 and the fourth position 22 have an identical maximum height, defined in the third direction Z, called $H_2$.

And, the following relationship is verified:

$$a = \frac{1}{f}\left(\frac{H_1}{2} + H_2 + \frac{H_3}{2}\right)$$

The two conditions mentioned above ensure that, at the level of the mask 4, the second portion 21' of the deposition (corresponding to the second portion 21' of the corresponding opening of the mask given of the homothety factor f) and the fourth portion 22' of the deposition (corresponding to the fourth portion 22 of the corresponding opening of the mask given the homothety factor f) have, of course, one same maximum height $H'_2$ (effect of the homothety factor f), buy also are in correspondence, i.e., extending over one same range of values on the side in the third direction Z (see FIG. 3b or FIG. 4b).

An additional condition is that the sum $S = L_3 + L_4$ of the variable widths in the third direction of the second portion 21 and of the fourth portion 22 of said masks, when the latter are placed opposite each other in the third direction Z, is constant and equal to $L_1$. From a practical standpoint, and to verify this aspect, in this case, when the masks are not presented on a common part, the mask 11a (first column 13) and the mask 12a (second column 14) can be taken, and the portions 21, 22 can be arranged in perfect correspondence.

It is thus ensured, in addition, on this portion of the deposition on the mask 4, that when the gripping means 7 is implemented to ensure a movement in the second direction Y, the association of the depositions relating to the portions 21', 22' will have the same effect as the deposition carried out thanks to the portions 23, 24 of constant dimensions of the masks.

FIG. 4b illustrates the deposition obtained on the substrate 4 at a predetermined instant from the arrangement of the masks 11a, 11b, 11c, 11d illustrated in FIG. 4a. The shapes 12a', 12b', 12c', 12d' are substantially identical to the openings 12a, 12b, 12c, 12d but different through their dimensions (homothety factor f).

As can be seen in FIG. 4b, the deposition comprises a first portion 21' and a second portion 22'. In comparison with the portions 21, 22 of FIG. 4a, the portions 21', 22' of FIG. 4b are in correspondence in the third direction Z (not offsetting).

The widths $L'_1$, $L'_2$, $L'_3$ and $L'_4$ of the depositions are respectively equal to the widths $L_1$, $L_2$, $L_3$ and $L_4$ to a near homothety factor f. The heights $H'_1$, $H'_2$ and $H'_3$ of the depositions are respectively equal to the heights $H_1$, $H_2$ and $H_3$ of the masks to a near homothety factor f.

The following aspects can also be noted.

The depositions 12a', 12b', 12c', 12d' obtained comprise the following features:
- an end 50 is situated at the same level, about the axis Z, that a border 51 situated inside the shape 12a', 12b', 12c', 12d'. The border 51 marks the end of the portion 21', 22', i.e. the point where the length $L'_3$, $L'_4$ no longer varies according to which is moved about the axis Z; and
- the sum S of the third width $L'_3$ and of the fourth width $L'_4$ is at any point of the axis Z, equal (or substantially equal) to the first width $L'_1$ and to the second width $L'_2$.

The border 51 marks the junction between the portions 21, 23 and between the portions 22, 24.

It will be noted that insofar as the axis of propagation of a jet 3 of nanometric sized particles passes through the corresponding centre Ca, Cb, Cc, Cd of a mask opening, the distance a, as the distance b, are interchanged when they are measured at the level of the mask or at the level of the deposition carried out on the substrate 4.

It must be noted that if the fact of using several masks already makes it possible to obtain depositions over a significant surface, the fact that the substrate 4 can be moved in the second direction Y makes it possible to achieve depositions over large surfaces, while conserving a homogeneity of the deposition. This implies a deposition of which the thickness is substantially constant.

Various mask shapes and consequently openings can be considered.

In FIG. 4a, masks have thus been represented, of which the opening has a hexagonal shape.

This hexagonal shape can, in particular, be regular when all the sides of the hexagon have an identical length. It is moreover the case in FIG. 4a (which implies, in particular, $H_1=H_3$).

Figure 5:
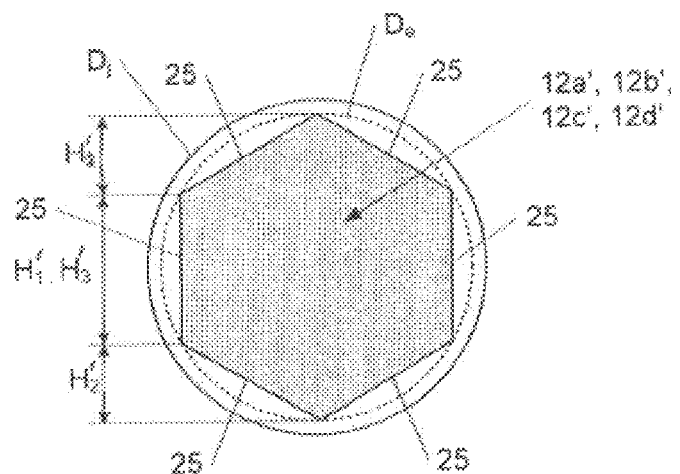

In reference to FIG. 5 which illustrates a deposition obtained (experimental test) by means of a mask of FIG. 4a, the shape 12a' obtained has a regular hexagonal shape larger than the opening 12a. This symmetrical shape is comprised in a circle of radius $D_e$. The sides 25 of the regular hexagon have therefore the same length and the angles between each of said sides 25 are substantially 120°.

In this particular case of the regular hexagon, it can be noted that:
$H'_1=H'_3=D_e/2$
$H'_2=D_e/4$ It results that a height $H'_{max}$ covered by a homogenous coating is calculated using the following formula:

$$H'_{max}=\frac{1}{4}(3n-1)D_e$$

where n is the number of masks 11a, 11b, 11c, 11d and also the number of production means 2a, 2b, 2c, 2d.

For $D_e=36.8$ mm, the height of the coating is 101.2 mm with 4 masks (n=4), these masks being, in this case, all identical. This height $H'_{max}$ has been represented in FIG. 4b.

In the absence of any mask, and given the divergence of the jet, the deposition carried out from one single and sole production means 2a would be of circular shape. The diameter Dj of the deposition associated with this production means is thus defined by:

$$D_j=2(d_1+d_2)\sin\alpha$$

where $\alpha$ is, as a reminder, the half-angle of divergence of the jet 3.

For this test, $D_e=0.9$. $D_j$ has been selected, to avoid the edge effects at the level of the mask. In the example considered, this gives a value of $D_j\approx40.89$ mm.

Thus, the homogenous deposition covers a surface of a height of about 10 cm on the substrate 4.

This test has been carried out with nanometric sized particles made of gold (Au).

The dimension about the axis Y thus depends on the amplitude of the movement of the substrate 4. In the case of a flexible substrate 4 in the form of a coil, it is possible to homogenously cover significant surfaces.

In the scope of this test, it has been selected, to take the following theoretical values:
$d_{th}=164$ mm,
$d_{2,th}=128$ mm,
which implies $f_{th}=d_{th}/(d_{2,th}+d_{th})\approx0.5616$ (theoretical homothety factor, that which is desired).

For an application with gold particles of 10 nm, it has (experimentally) been able to be observed that $d_{1,th}=d_{th}-4$ mm=160 mm. The true homothety factor (taken from the point P of divergence of the jet 3, such as defined above) is thus $d_{1,th}/(d_{2,th}+d_{1,th})\approx0.5556$.

If it is deemed that the difference between the true homothety factor and the theoretical homothety factor is significant, this implies to have to make an adjustment of the distances d, $d_1$ and $d_2$ on the device so as to find the theoretical homothety factor.

In practice, the distance $d+d_2$ is constant, just like the distance $d_1+d_2$.

The adjustment (when it is deemed necessary) is done by translating the masks, in the first direction X, which implies changing the distances d, $d_1$ and $d_2$ without changing the sum $d+d_2$ (also without changing the sum $d_1+d_2$).

During this adjustment, $d_{th}$ therefore becomes d, $d_{1,th}$ becomes $d_1$ and $d_{2,th}$ becomes $d_2$, with $d_{th}+d_{2,th}=d+d_2$ (and also $d_{1,th}+d_{2,th}=d_1+d_2$). In this adjustment, the theoretical homothety factor must also be found (that which is desired), hence the relationship $f_{th}=d_{th}/(d_{th}+d_{2,th})=d_1/(d_1+d_2)$.

So:

$$d_1=d_{th}[1-(d_{th}-d_{1,th})/(d_{th}+d_{2,th})](R_a)$$

and:

$$d_2 = d_{2,th} + d_{1,th} - d_1(R_b)$$

The distance $d = d_{th} - d_{1,th} + d_1(R_e)$ can thus experimentally be adjusted.

If the preceding example is taken with gold nanoparticles of 10 nm, $d_{th} - d_{1,th} = 4$ mm is had, and $d_1 = 161.75$ mm and $d_2 = 126.25$ mm are thus obtained (in the passage, it can be verified that $d_1 + d_2 = 288$ mm $= d_{1,th} + d_{2,th}$).

There are only the following to physically adjust: the distance $d = d_1 + d_{th} - d_{1,th} = 161.75 + 4 = 165.75$ mm (it can be verified that $d_{th}/(d_{th} + d_{2,th}) = d_1/(d_1 + d_2) \approx 0.5616$).

The true homothety factor, adjusted, namely the quantity $f = d_1/(d_1 + d_2)$ is now that which was wanted theoretically. It is actually this true adjusted homothety factor, which is mentioned in the appended claims.

Of course, when it is observed (experimentally) that $d_{th} = d_{1,th}$, no adjustment is necessary. In this case, $d = d_{th}$, $d_1 = d_{th}$ and consequently $d_2 = d_{2,th}$ (particular case of the relationships $(R_a)$, $(R_b)$ and $(R_c)$ above).

The value of $d = 165.75$ mm is close to $d_{th} = 164$ mm, which implies that d is close to $d_1$. However, in practice, this proximity can, despite everything, have a significant impact on the result (homogeneity) of the deposition. From a theoretical standpoint, the distance $d - d_1$ ($= d_{th} - d_{1,th}$) is not known. Numerical simulations can give an idea of this distance $d - d_1$, but it is generally observed that there is a significant difference with respect to what can be measured experimentally. Consequently, in practice, the adjustment is made experimentally by successive approximations. This experimental adjustment is moreover effective, insofar as the distance $d - d_1$ greatly depends on the nature of the particles used. Thus, and for example, for silicon particles of 50 nm, it has been able to be observed that $d - d_1 = 2$ mm.

Finally, always for this test, $f \approx 0.5616$ is therefore had, with $d_1 = 161.75$ mm and $d_2 = 126.5$ mm and the diameter De, so: De $\approx 36.8$ mm. This diameter De can also be expressed in the form $De = (1/f)*(H_1 + 2H_2)$, see FIG. 5 where it is noted that $De = H'_1 + 2H'_2$ and insofar as $H'_1 = (1/f)H_1$ and $H'_2 = (1/f)H_2$. Moreover, due to the geometry of the regular hexagon, it is possible to make a link between $H_2$ and $H_1$, namely $H_2 = H_1 \sin(\pi/6)$. From this, it is deduced that $H_1 \approx 10.33$ mm (all the sides of the regular hexagon have the same value) and $H_2 \approx 5.17$ mm. Moreover, always due to the regular hexagon shape, it is deduced that $L_1 = 2H_1 \cos(\pi/6) \approx 17.89$ mm $= L_2$. Moreover, from the relationship between $D_j$ and the half-angle of the jet 3, it is deduced that $\sin(\alpha) \approx 40.89/(2*288) \approx 0.071$ which results in a half-angle $\alpha$ of divergence of the jet 3 of a little more than 4°. The value of the distance a can also be estimated at $a \approx 27.6$ mm by the equation mentioned above. In this test, it is sufficient, moreover, that $b \geq 15.93$ mm to avoid any covering.

Regular hexagonal-shaped footprints have several advantages. They allow an identical pattern on the columns of lenses. They are relatively easy to achieve and make it possible to filter a minimum amount of particles, as the surface of the openings 12a, 12b, 12c, 12d is maximised. This allows an overall increased particle deposition speed.

Another shape is represented in FIGS. 3a and 3b. Here, the masks 11a, 11c have a different footprint from the masks 11b, 11d. The features inherent to the heights $H_1$, $H_2$, $H_3$ and to the widths $L_1$, $L_2$, $L_3$ and $L_4$ mentioned above, are also applied to this embodiment.

Also, another shape of the masks 11a, 11b, 11c, 11d is illustrated in FIG. 6a. In this figure, the footprint of the mask 11a, 11b, 11c, 11d is separated into two by a central strip 26 which extends along the axis Z. The footprint thus forms two isosceles trapeziums 39. The features inherent to the widths $H_1$, $H_2$, $H_3$ and to the widths $L_1$, $L_2$, $L_3$ and $L_4$ mentioned above, are also applied to this embodiment. The strip 26 advantageously makes it possible to filter a central zone of the jet 3 of particles. Indeed, in certain cases, the particles can have a distribution of size making large nanoparticles appear, due to a partial agglomeration of the particles. The aerodynamic behaviour of the agglomerated particles is different from that of non-agglomerated particles. In particular, their angle of divergence is a lot less than that of non-agglomerated particles. This results, in this case, in a spatial distribution of the jet 3 of non-homogenous particles concentrated at the centre of the jet 3 causing a strong overintensity in this place. The strip 26 thus makes it possible to filter the central portion of the jet 3 of particles.

The footprint is formed on the base of the hexagon of the embodiment of FIGS. 4a and 5. It will be noted that the hexagon is no longer strictly regular. It has been slightly extended along the axis Z so that the top and bottom peaks 27 coincide with the circle of radius $D_e$. Thus, the dimension along the axis Z covered by the coating remains unchanged with respect to the mask of FIGS. 4a and 5. The only difference resides in the fact that the deposition speed will be slightly decreased.

Generally, the invention is implemented with one mask per column 13, 14.

Of course, and as is moreover represented in FIG. 3a or 4a, it is advantageous to provide several masks per column 13, 14. In this case, it is understood on the one hand, that the masks, and in particular their openings, of the first column 13 are identical and on the other hand, the masks, and in particular their openings, of the second column 14 are also identical. The masks and the openings associated with the second column and with the first column can thus be identical (FIG. 4a) or different (FIG. 3a). However, it is understood that, if for example the embodiment of FIG. 3a is taken, the mask 11c (first column 13, second mask) and the mask 11d (second column 14, second mask) are arranged together in the same way as the masks 11a (first column 13, first mask) and 11b (second column 14, first mask) are. Moreover, the mask 11c (first column 13, second mask) has an arrangement, regarding the mask 11b (second column 14, first mask) identical to the arrangement which is provided between the masks 11a and 11b.

Figure 7:
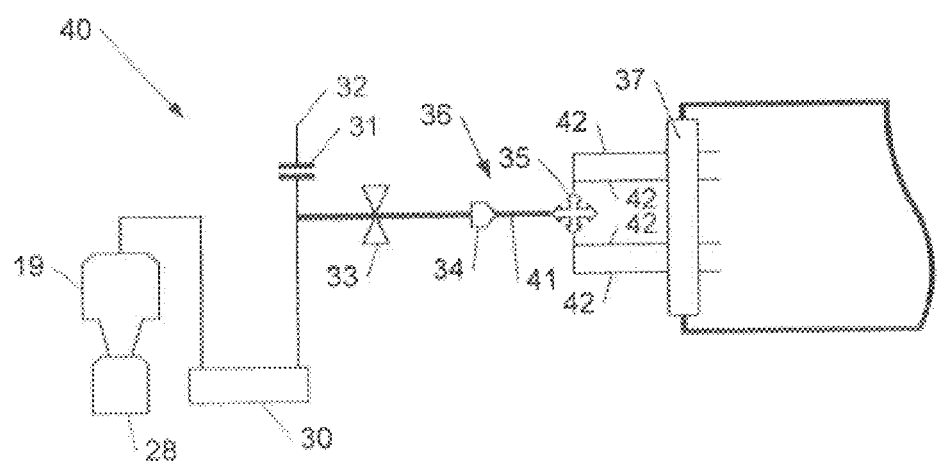
FIG. 7 is a schematic representation of a system for transporting particles according to the invention.

In FIG. 7, a system 40 for transporting particles before they arrive in the production means 2a, 2b, 2c, 2d is represented.

The transporting system 40 comprises:
a colloidal suspension 28,
a generator 29 of aerosols from the colloidal suspension 28,
optionally a drier 30 for drying the aerosols,
a filter 31 (optional),
a discharge 32,
a valve 33 able to open or close the flow of aerosols to the means 2a, 2b, 2c, 2d, in this case, aerodynamic lenses,
a critical orifice 34,
a flow separator 35,
a buffer volume 36 situated between the critical orifice 34 and the flow separator 35, and
a flange 37 for distribution to the aerodynamic lenses 2a, 2b, 2c, 2d.

The particles are generated, via the generator 29 from the colloidal suspension 28, of which a solvent can be, for example, water. When water is used as a solvent, the transporting system 40 comprises a drier 30 through which pass the aerosols produced via the aerosol generator 29. By capturing the water molecules, the drier 30 allows the droplets produced by the aerosol generator of rapidly being evaporated, and therefore to provide at its outlet, dry aerosols carried by a carrier gas with no solvent molecules.

When the valve 33 is open, a portion of the aerosol flow is transported to the critical orifice 34, of which the diameter determines the volume flow oriented towards the aerodynamic lenses 2*a*, 2*b*, 2*c*, 2*d*. The flow at the outlet of the aerosol generator 29 is comprised between 2 and 3slm (standard litres per minute). Each aerodynamic lens 2*a*, 2*b*, 2*c*, 2*d* needs a flow of the order of 0.15slm for a divergent lens of standard geometry.

The flow not used by the aerodynamic lenses 2*a*, 2*b*, 2*c*, 2*d* is sent to the discharge 32. The diameter of the critical orifice 34 is determined according to the number of aerodynamic lenses 2*a*, 2*b*, 2*c*, 2*d* to be supplied. This diameter is comprised between 350 microns and 550 microns for four aerodynamic lenses 2*a*, 2*b*, 2*c*, 2*d* and with argon as a carrier gas.

The use of one single critical orifice 34 placed before the flow separator 35 has the advantage of improving the robustness of the transportation system 40, as the critical orifice 34 is less likely to be clogged. Indeed, in a variant, several critical orifices could be used, for example, one for each aerodynamic lens 2*a*, 2*b*, 2*c*, 2*d*. In this case, the critical orifices have a lower diameter, of the order of 200 μm with argon as a carrier gas, and can be clogged more easily.

In order to equally distribute the flow of aerosols in the aerodynamic lenses 2*a*, 2*b*, 2*c*, 2*d*, it is preferable that the pipes lead the aerosols from the flow separator to the aerodynamic lenses 2*a*, 2*b*, 2*c*, 2*d* have the same dimensions, and that the volume comprised between the critical orifice 34 and the flow separator 35 is made minimal. This makes it possible to avoid a non-homogenous dispersion having the time to be put in place between the critical orifice 34 and the flow separator 35. Advantageously, this volume is less than 10 $cm^3$.

Advantageously, a pipe 41 between the critical orifice 34 and the flow separator 35 is rigid and can be presented in the form of a tube, for example, of diameter less than 8 mm and of length of 5 cm, which gives a volume of about 2.5 $cm^3$.

A homogenous spatial distribution of the particles in the different volumes of the pipes 42, contributes to the homogeneity of the coatings. In order to improve this spatial distribution, pipes 42 between the flow separator 35 and the flange 37 for distributing to the aerodynamic lenses 2*a*, 2*b*, 2*c*, 2*d* are advantageously straight or slightly curved. Given the volume flow normally used in a divergent aerodynamic lens of standard geometry (0.15 slm), the pipes advantageously do not comprise any curves of a radius less than 5 cm on an arc greater than Pi/4 radians.

The invention claimed is:

1. A device (1) for depositing nanometric sized particles on a substrate (4) characterised in that the device (1) comprises:

production means (2*a*, 2*b*, 2*c*, 2*d*) each able to produce, from an end (60*a*, 60*b*, 60*c*, 60*d*) of the production means (2*a*, 2*b*, 2*c*, 2*d*), a jet (3) of nanometric sized particles, each of said production means being configured to have a longitudinal axis oriented in a first direction (X) defining an axis of propagation of the jet (3), and configured so that the jet (3) is divergent from a point P of divergence with a half-angle of divergence α with respect to its axis of propagation, the production means being arranged so that the various longitudinal axes are parallel to each other and in the form of at least one first column (9) and one second column (10) offset against each other in a second direction (Y) orthogonal to the first direction (X), where the first column (9) of production means and the second column (10) of production means each comprise at least one production means (2*a*, 2*b*, 2*c*, 2*d*), said at least one production means (2*a*, 2*b*, 2*c*, 2*d*) of the first column (9) of production means being moreover offset with respect to said at least one production means (2*a*, 2*b*, 2*c*, 2*d*) of the second column (10) of production means in a third direction (Z), both orthogonal to the first direction (X) and to the second direction (Y), an expansion chamber (15), wherein at least each end (60*a*, 60*b*, 60*c*, 60*d*) of the production means (2*a*, 2*b*, 2*c*, 2*d*) is housed;

a deposition chamber (5) comprising:

said substrate (4);

a means (7) for gripping the substrate (4), able to move said substrate (4) in the second direction (Y);

a plurality of masks (11, 11*a*, 11*b*, 11*c*, 11*d*) each comprising an opening (12, 12*a*, 12*b*, 12*c*, 12*d*), each mask being situated, in the first direction (X) defining the direction of propagation of the jet, between a production means (2*a*, 2*b*, 2*c*, 2*d*) and the substrate (4) and therefore said masks are also presented in the form of at least one first column (13) and one second column (14) offset against each other in the second direction (Y), where the first column (13) of masks and the second column (14) of masks each comprise at least one mask, said at least one mask (11*a*, 11*b*) of the a first column (13) of masks being moreover offset with respect to said at least one mask (11*c*, 11*d*) of the second column (14) of masks in the third direction (Z), and therefore, in the first direction (X) defining the propagation of the jet, the masks (11, 11*a*, 11*b*, 11*c*, 11*d*) are separated by a first distance $d_1$ from the point P of divergence of the jet (3) and by a second distance $d_2$ from the substrate (4) and each opening (12*a*, 12*b*, 12*c*, 12*d*) being provided with a centre (Ca, Cb, Cc, Cd) through which passes the longitudinal axis of the associated production means, the centres (Ca, Cb, Cc, Cd) of two openings which are closest to each other and belonging to different columns (13, 14) of masks being separated by a distance a in the third direction (Z) and a distance b in the second direction (Y), each opening (12*a*, 12*b*, 12*c*, 12*d*) of a mask being inscribable in a circle of diameter $2d_1 \sin \alpha$, the opening (12*a*, 12*c*) of said at least one mask of the first column (13) of masks defining:

a first central portion (23), of which a width L1, defined in the second direction (Y), is constant, and of which a height H1, defined in the third direction (Z), is also constant, a second portion (21), of which a width L3, defined in the second direction (Y), is variable in the third direction (Z), the opening (12*b*, 12*d*) of said at least one mask of the second column (14) of masks defining:

a third central portion (24), of which a width $L_2$, defined in the second direction (Y), is constant and equal to the width $L_1$, and of which a height $H_3$, defined in the third direction (Z), is also constant, and a fourth portion (22), of which a width $L_4$, defined in the second direction (Y), is variable in the third direction (Z), said second portion (21) and fourth portion (22) being, on the one hand, situated between said first portion (23) and third portion (24) and having, on the other hand, a maximum height $H_2$, defined in the third identical direction (Z), a sum $S=L_3+L_4$ of the variable widths in the third direction of the second portion (21) and the fourth portion (22) of said masks, when the masks are placed opposite each other, in the third direction (Z), being constant and equal to $L_1$, the following relationships being furthermore respected:

$$a = \frac{1}{f}\left(\frac{H_1}{2} + H_2 + \frac{H_3}{2}\right) \text{ and } b \geq \frac{1}{f}\frac{L_1}{2}$$

where:

$$f = \frac{d_1}{d_1 + d_2}.$$

2. The device according to claim 1, wherein the shape of the opening (12a, 12c) of said at least one mask of the first column (13) of masks differs from the shape of the opening (12b, 12d) of said at least one mask of the second column (14) of masks.

3. The device according to claim 1, wherein the opening (12a, 12c) of said at least one mask of the first column (13) of masks and the opening (12b, 12d) of said at least one mask of the second column (14) of masks have identical shapes.

4. The device (1) according to claim 1, wherein the opening (12a, 12c) of said at least one mask of the first column (13) of masks and the opening (12b, 12d) of said at least one mask of the second column (14) of masks have a hexagonal shape.

5. The device according to claim 4, wherein said at least one mask of the first column (13) of masks and said at least one mask of the second column (14) of masks comprise a strip (26) which extends in the third direction (Z) and separates each of their respective openings into two.

6. The device according to claim 1, comprising at least one system for depositing (6a, 6b) a matrix on the substrate.

7. The device according to claim 1, further comprising a plurality of systems (6a, 6b) for depositing a matrix on the substrate, said deposition systems (6a, 6b) being arranged symmetrically with respect to the first direction (X).

8. The device according to claim 1, wherein a position of at least one system (6a, 6b) for depositing a matrix on the substrate is adjustable, to vary a distance between the at least one system and the substrate and/or the deposition angle of the matrix with respect to the substrate.

9. An assembly comprising a device (1) according to claim 1 and a system (40) for transporting particles intended to supply the production means (2a, 2b, 2c, 2d) of said device (1), the system (40) comprising means (28, 29, 30, 31, 32, 33) able to generate an aerosol, a critical orifice (34), a flow separator (35), a flange (37) for distributing the production means (2a, 2b, 2c, 2d) and a buffer volume (36) situated between the critical orifice (36) and the flow separator (35) wherein, the critical orifice 34) is placed upstream of the flow separator (35) in the direction of transportation of the aerosol through the system for transporting particles.

10. The assembly according to claim 9, wherein a volume of pipe(s) (41) between the critical orifice (34) and the flow separator (35) is less than or equal to 10 cm³.

11. The assembly according to claim 9, wherein pipes (42) between the flow separator (35) and the distribution flange (37) are straight or slightly curved such that the pipes comprise curves of a radius more than 5 cm on an arc greater than Pi/4 radians.

* * * * *